US012777652B2

(12) United States Patent
Wang et al.

(10) Patent No.: US 12,777,652 B2
(45) Date of Patent: Oct. 27, 2026

(54) MEMORY STRUCTURE AND MANUFACTURING METHOD THEREOF

(71) Applicant: United Microelectronics Corp., Hsinchu (TW)

(72) Inventors: Chia-Wen Wang, Tainan City (TW); Chien-Hung Chen, Hsinchu City (TW); Chia-Hui Huang, Tainan City (TW); Ling Hsiu Chou, Tainan City (TW); Jen Yang Hsueh, Tainan City (TW); Chih-Yang Hsu, Tainan City (TW)

(73) Assignee: United Microelectronics Corp., Hsinchu (TW)

( * ) Notice: Subject to any disclaimer, the term of this patent is extended or adjusted under 35 U.S.C. 154(b) by 415 days.

(21) Appl. No.: 18/494,747

(22) Filed: Oct. 25, 2023

(65) Prior Publication Data

US 2025/0113488 A1 Apr. 3, 2025

(30) Foreign Application Priority Data

Oct. 3, 2023 (TW) ................................ 112137918

(51) Int. Cl.
*H10B 43/30* (2023.01)

(52) U.S. Cl.
CPC .................................. *H10B 43/30* (2023.02)

(58) Field of Classification Search
None
See application file for complete search history.

(56) References Cited

U.S. PATENT DOCUMENTS

| | | | | |
|---|---|---|---|---|
| 7,294,573 | B1 | 11/2007 | Achuthan et al. | |
| 8,367,534 | B2 | 2/2013 | Chen et al. | |
| 2018/0315702 | A1* | 11/2018 | Kawashima ........... | H10B 43/40 |
| 2020/0075614 | A1* | 3/2020 | Huang ............... | H10D 30/6893 |

* cited by examiner

*Primary Examiner* — Jay C Chang
(74) *Attorney, Agent, or Firm* — JCIPRNET

(57) ABSTRACT

Provided are a memory structure and a manufacturing method thereof. The memory structure includes a substrate having first and second regions, first and second isolation structures in the substrate, a charge storage layer on the substrate, first and second gates and doped regions. The first isolation structures define first active areas in the first region. A top surface of the first isolation structure is higher than that of the substrate. The second isolation structures define second active areas in the second region. A top surface of the second isolation structure is lower than that of the substrate. The first gate is on the charge storage layer in the first active area. The second gate is on the charge storage layer in the second active area. The doped regions are in the substrate at two sides of the first gate and at two sides of the second gate.

20 Claims, 16 Drawing Sheets

MEMORY STRUCTURE AND MANUFACTURING METHOD THEREOF

CROSS-REFERENCE TO RELATED APPLICATION

This application claims the priority benefit of Taiwan application serial no. 112137918, filed on Oct. 3, 2023. The entirety of the above-mentioned patent application is hereby incorporated by reference herein and made a part of this specification.

BACKGROUND

Technical Field

The present invention relates to a memory structure, and in particular to a memory structure based on a silicon-oxide-nitride-oxide-silicon (SONOS) stacked configuration.

Description of Related Art

The existing memories including a SONOS stacked configuration may be classified into analog memories and digital memories. In the manufacturing process of a memory, based on the structural differences between the analog memory and the digital memory, it is difficult to integrate the process of the analog memory and the process of the digital memory, and to integrate the analog memory and the digital memory on the same substrate or wafer. In particular, for memories based on a SONOS stacked configuration including a high dielectric constant (high-k) layer and a replacement metal gate (RMG), it is difficult to integrate the analog memory and the digital memory.

SUMMARY

The present invention provides a memory structure and a manufacturing method thereof, wherein the analog memory based on the SONOS stacked configuration and the digital memory based on the SONOS stacked configuration are integrated on the same substrate.

The memory structure of the present invention includes a substrate, first isolation structures, second isolation structures, a charge storage layer, a first gate, a second gate and doped regions. The substrate has a first region and a second region. The first isolation structures are disposed in the substrate in the first region to define first active areas, wherein a top surface of each of the first isolation structures is higher than a top surface of the substrate. The second isolation structures are disposed in the substrate in the second region to define second active areas, wherein a top surface of each of the second isolation structures is lower than the top surface of the substrate. The charge storage layer is disposed on the substrate in the first active areas and the second active areas. The first gate is disposed on the charge storage layer in the first active areas. The second gate is disposed on the charge storage layer in the second active areas. The doped regions are disposed in the substrate at two sides of the first gate and at two sides of the second gate.

In an embodiment of the memory structure of the present invention, a material of the first gate and the second gate comprises polysilicon.

In an embodiment of the memory structure of the present invention, a material of the first gate and the second gate comprises metal, and the memory structure further comprises a high-k layer disposed between the first gate and the charge storage layer and between the second gate and the charge storage layer.

In an embodiment of the memory structure of the present invention, the first region is an analog memory device region, and the second region is a digital memory device region.

In an embodiment of the memory structure of the present invention, the memory structure further includes first spacers and second spacers, wherein the first spacers are disposed on sidewalls of the first gate, and the second spacers are disposed on sidewalls of the second gate.

In an embodiment of the memory structure of the present invention, the charge storage layer is further located between the first spacers and the substrate and between the second spacers and the substrate.

The manufacturing method of the memory structure of the present invention includes the following steps. A substrate having a first region and a second region is provided. First isolation structures are formed in the substrate in the first region to define first active areas, wherein a top surface of each of the first isolation structures is higher than a top surface of the substrate. Second isolation structures are formed in the substrate in the second region to define second active areas, wherein a top surface of each of the second isolation structures is lower than the top surface of the substrate. A charge storage layer is formed on the substrate in the first active areas and the second active areas. A first gate is formed on the charge storage layer in the first active areas. A second gate is formed on the charge storage layer in the second active areas. Doped regions are formed in the substrate at two sides of the first gate and at two sides of the second gate.

In one embodiment of the manufacturing method of the memory structure of the present invention, a forming method of the first isolation structures and the second isolation structures includes the following steps. A plurality of initial isolation structures are formed in the substrate, wherein a top surface of each of the plurality of initial isolation structures is higher than the top surface of the substrate. A thermal treatment is performed on the plurality of initial isolation structures. An implantation process is performed on the initial isolation structures in the second region. A wet etching process is performed on the initial isolation structures in the first region and the second region.

In one embodiment of the manufacturing method of the memory structure of the present invention, a temperature of the thermal treatment is between 850° C. and 1050° C.

In one embodiment of the manufacturing method of the memory structure of the present invention, a time of the thermal treatment is between 30 seconds and 60 seconds.

In one embodiment of the manufacturing method of the memory structure of the present invention, a dopant used in the implantation process comprises neutral atoms.

In one embodiment of the manufacturing method of the memory structure of the present invention, the neutral atoms include C, Ge, Ar or a combination thereof.

In one embodiment of the manufacturing method of the memory structure of the present invention, a forming method of the first gate, the second gate and the charge storage layer includes the following steps. A charge storage material layer and a gate material layer are formed sequentially on the substrate, the first isolation structures and the second isolation structures. A patterning process is performed to remove a part of the gate material layer to form the first gate and the second gate. The charge storage material layer at two sides of the first gate and at two sides of the second gate to form the charge storage layer are removed.

In one embodiment of the manufacturing method of the memory structure of the present invention, the manufacturing method further includes performing a planarization process on the gate material layer after forming the gate material layer and before performing the patterning process.

In one embodiment of the manufacturing method of the memory structure of the present invention, the manufacturing method further includes performing an etching-back process on the gate material layer after performing the planarization process and before performing the patterning process.

In one embodiment of the manufacturing method of the memory structure of the present invention, the manufacturing method further includes forming first spacers on sidewalls of the first gate and second spacers on sidewalls of the second gate after forming the first gate and the second gate.

In one embodiment of the manufacturing method of the memory structure of the present invention, a forming method of the first spacers and the second spacers includes the following steps. A spacer material layer is formed on the substrate, wherein the spacer material layer covers a top surface of the first gate and a top surface of the second gate. A part of the spacer material layer is removed to form the first spacers and the second spacers.

In one embodiment of the manufacturing method of the memory structure of the present invention, a method for removing the part of the spacer material layer includes the following steps. A chemical mechanical polishing (CMP) process is performed on the spacer material layer to remove a part of the spacer material layer. An anisotropic etching process is performed on a remaining portion of the spacer material layer until the top surface of the first gate and the top surface of the second gate are exposed.

In one embodiment of the manufacturing method of the memory structure of the present invention, a material of the first gate and the second gate includes polysilicon.

In one embodiment of the manufacturing method of the memory structure of the present invention, the manufacturing method further includes the following steps. A high-k layer is formed between the first gate and the charge storage layer and between the second gate and the charge storage layer. The polysilicon is removed. A metal material is formed on the high-k layer.

Based on the above, in the memory structure of the present invention, the analog memory based on the SONOS stacked configuration and the digital memory based on the SONOS stacked configuration are integrated on the same substrate.

In addition, in the manufacturing method of the memory structure of the present invention, the components of the analog memory and the components of the digital memory may be formed simultaneously, and the isolation structures with different thicknesses may be formed. Therefore, the process of the analog memory and the process of the digital memory may be integrated together.

DESCRIPTION OF THE EMBODIMENTS

The embodiments are listed below and described in detail with the accompanying drawings, but the provided embodiments are not intended to limit the scope of the present invention. In addition, the drawings are for illustration purposes only and are not drawn to original scale. In order to facilitate understanding, the same devices will be described with the same symbols in the following descriptions.

In the text, the terms mentioned in the text, such as "comprising", "including", "containing" and "having" are all open-ended terms, i.e., meaning "including but not limited to".

When using terms such as "first" and "second" to describe elements, it is only used to distinguish the elements from each other, and does not limit the order or importance of the devices. Therefore, in some cases, the first element may also be called the second element, the second element may also be called the first element, and this is not beyond the scope of the present invention.

In addition, the directional terms, such as "on", "above", "under" and "below" mentioned in the text are only used to refer to the direction of the drawings, and are not used to limit the present invention.

Also, herein, a range expressed by "one value to another value" is a general representation to avoid enumerating all values in the range in the specification. Thus, the recitation of a particular numerical range encompasses any numerical value within that numerical range, as well as smaller numerical ranges bounded by any numerical value within that numerical range.

The inventor found that in the structure of the analog memory, the top surface of the isolation structure used to define the active area (AA) is preferably higher than the top surface of the substrate to reduce the charge loss path at the corners of the active area. In addition, in the structure of the digital memory, the top surface of the isolation structure used to define the active area is preferably lower than the top surface of the substrate to obtain a larger effective diffusion width and better initialization threshold voltage (Vt) distribution. Therefore, the inventor proposes a technical solution that the analog memory and the digital memory are integrated on the same substrate or wafer and the processes of the analog memory and the digital memory are integrated.

FIGS. 1A to 1G are schematic top views of the manufacturing process of the memory structure of the first embodiment of the present invention. FIGS. 2A to 2G are schematic cross-sectional views of the manufacturing process along the line I-I in FIGS. 1A to 1G. In the present embodiment, the process of the analog memory and the process of the digital memory are integrated, so that the analog memory and the digital memory may be integrated on the same substrate or wafer. The present invention will be described in detail below.

Figure 1A:
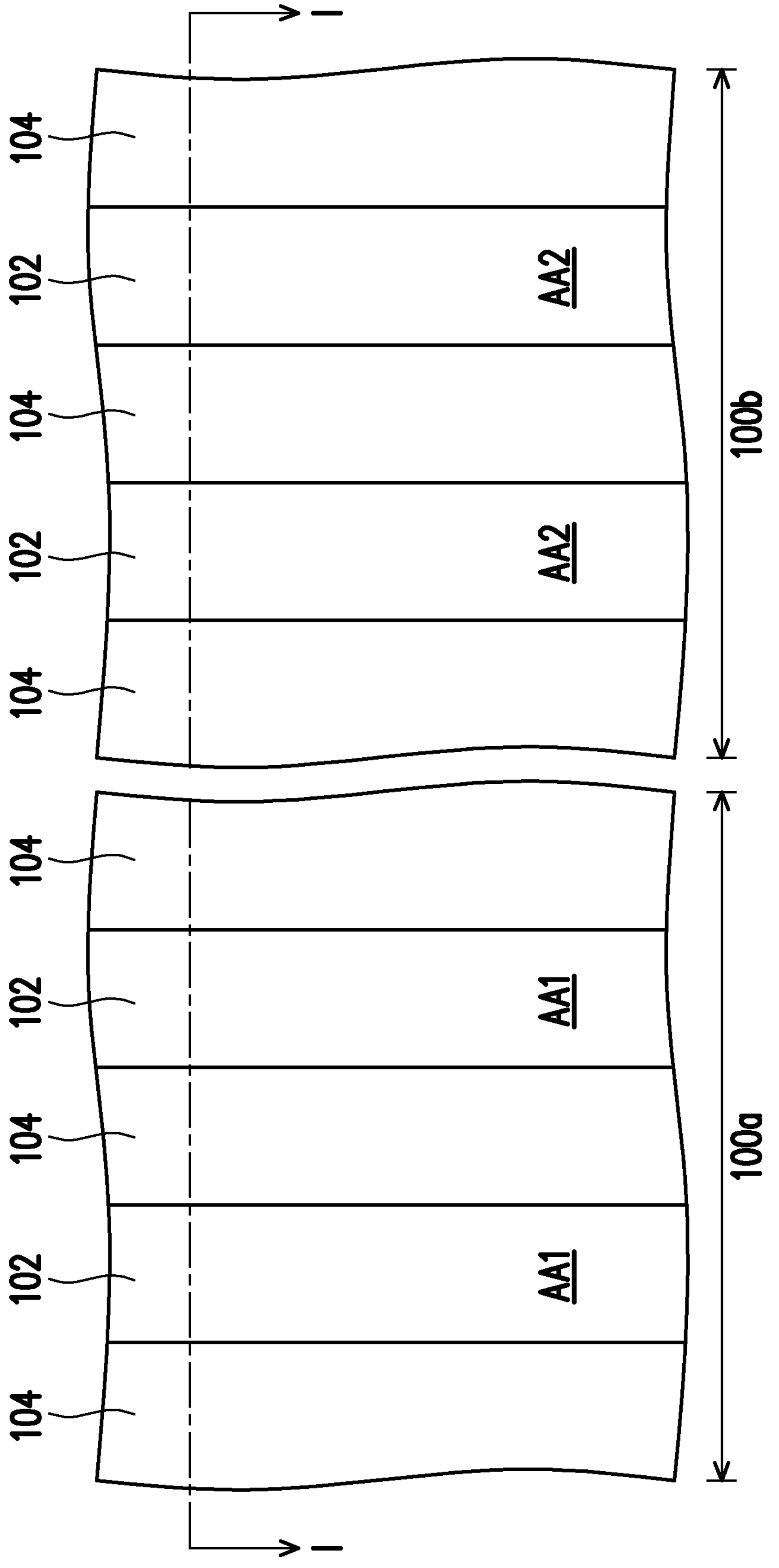
FIGS. 1A to 1G are schematic top views of the manufacturing process of the memory structure of the first embodiment of the present invention.
Figure 2A:
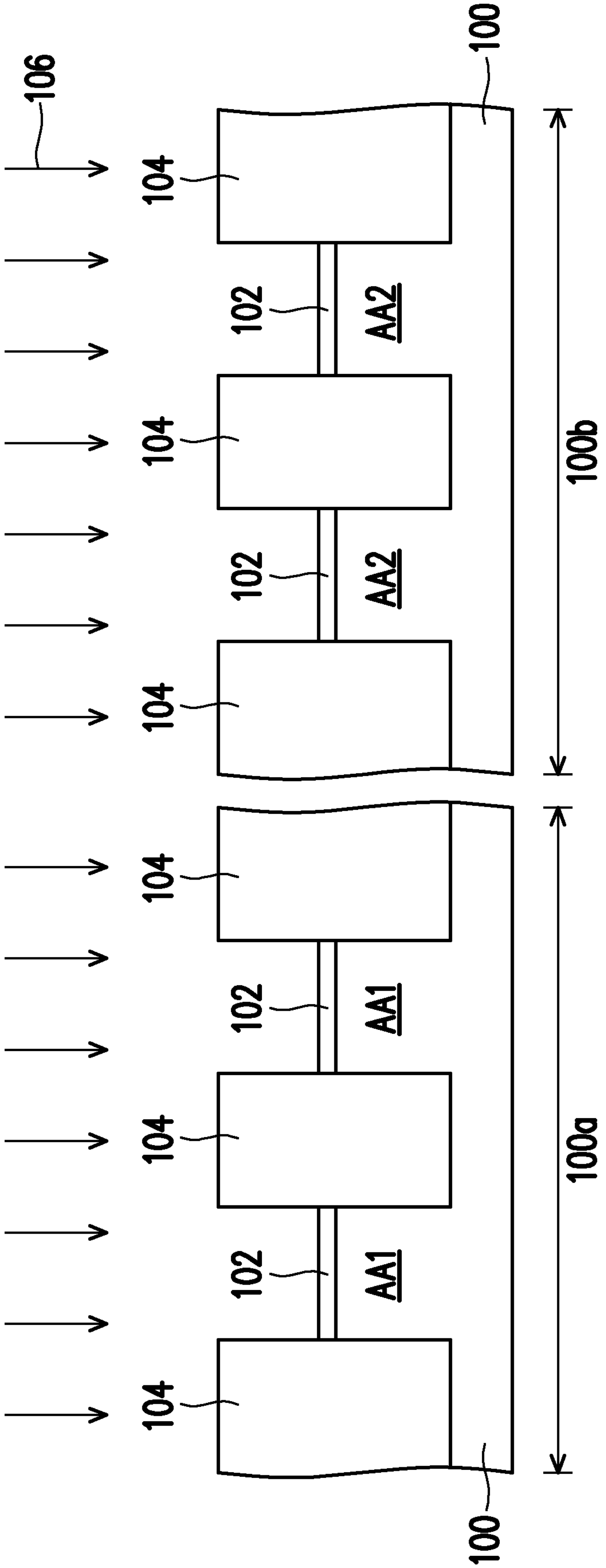
FIGS. 2A to 2G are schematic cross-sectional views of the manufacturing process along the line I-I in FIGS. 1A to 1G.

Referring to FIGS. 1A and 2A, a substrate 100 is provided. In the present embodiment, the substrate 100 may be a silicon substrate or a silicon wafer. The substrate 100 has a first region 100*a* and a second region 100*b*. In the present embodiment, the first region 100*a* is an analog memory device region, and the second region 100*b* is a digital memory device region. Then, a pad oxide layer 102 may be formed on the substrate 100. In the present embodiment, the forming method of the pad oxide layer 102 is, for example, a thermal oxidation process, but the present invention is not limited thereto.

Then, a plurality of initial isolation structures 104 are formed in the substrate 100. In the present embodiment, the initial isolation structure 104 is, for example, a shallow trench isolation (STI) structure. The forming method of the initial isolation structure 104 is well known to those skilled in the art and will not be described further here. In the present embodiment, the initial isolation structures 104 in the first region 100*a* define a plurality of first active areas AA1 arranged parallel to each other, and the initial isolation structures 104 in the second region 100*b* define a plurality of second active areas AA2 arranged parallel to each other. In addition, the top surface of the initial isolation structure 104 is higher than the top surface of the substrate 100 in the first active area AA1, and is higher than the top surface of the substrate 100 in the second active area AA2.

Then, a thermal treatment 106 is performed on the initial isolation structures 104. In the present embodiment, the temperature of the thermal treatment 106 is between 850° C. and 1050° C., and the time of the thermal treatment 106 is between 30 seconds and 60 seconds. After the thermal treatment 106, the initial isolation structures 104 may become denser, so the initial isolation structures 104 may have a lower etching rate in the subsequent etching process. In addition, after the thermal treatment 106, the pad oxide layer 102 may also become denser and may have a lower etching rate in the subsequent etching process.

Figure 1B:
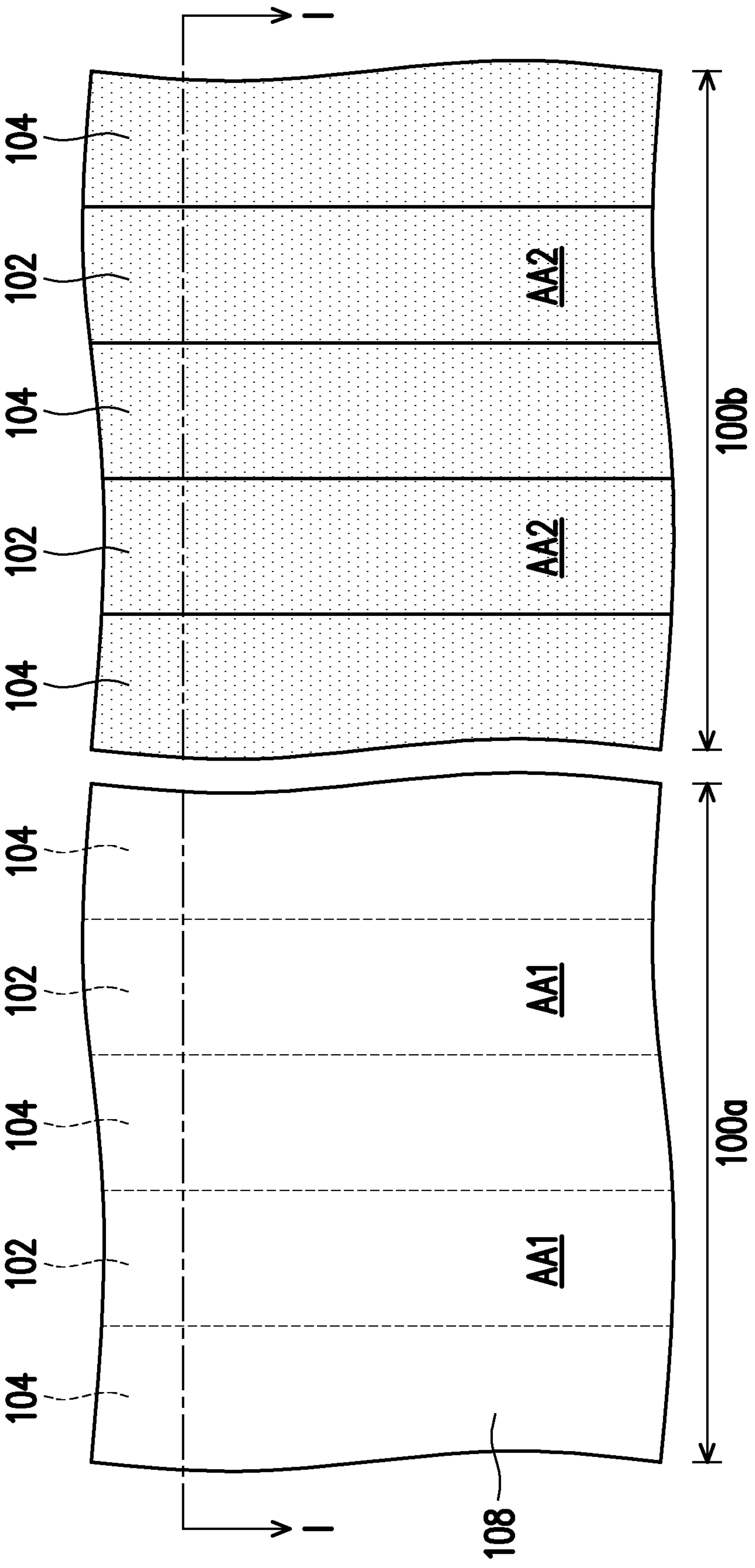
Figure 2B:
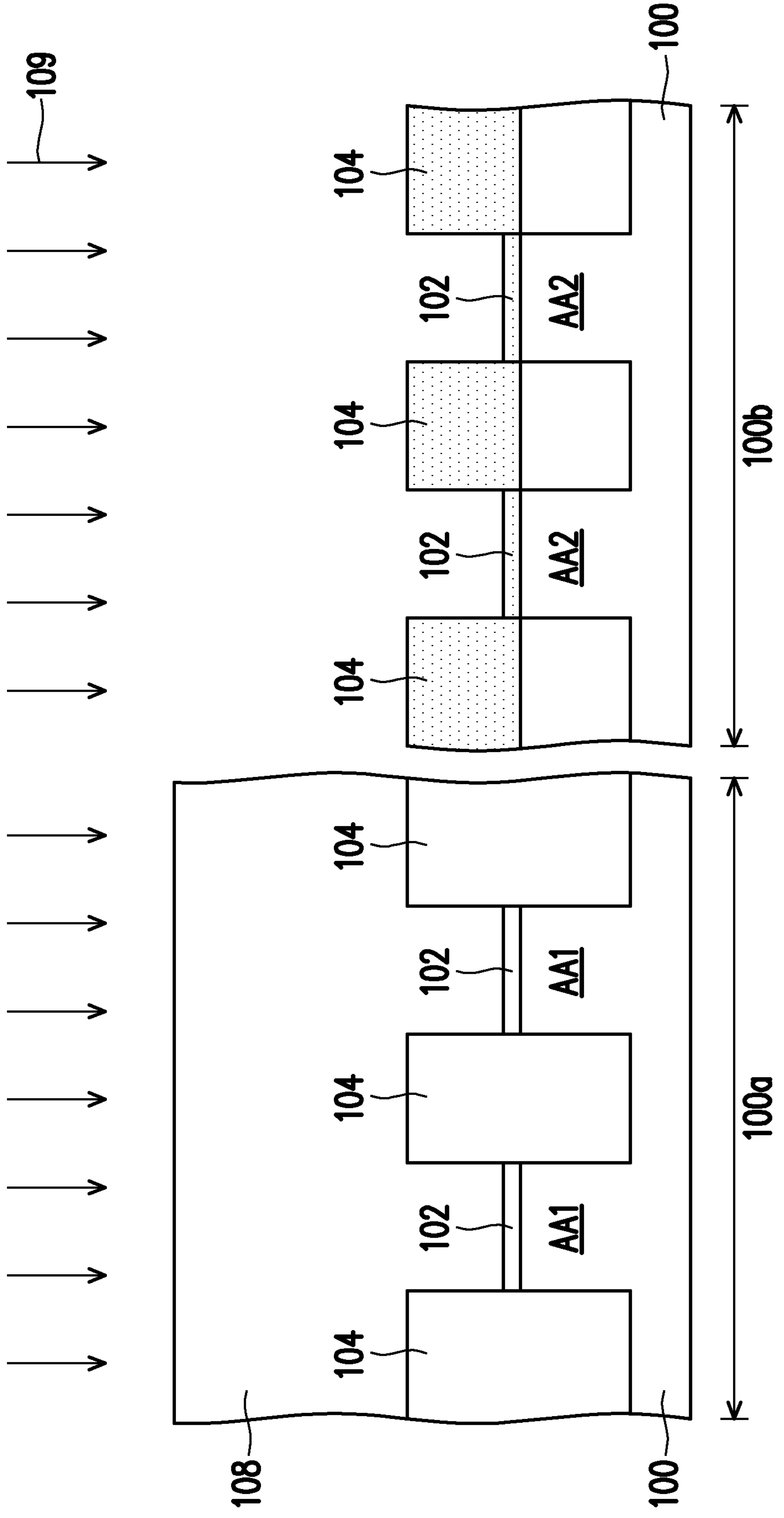

Referring to FIGS. 1B and 2B, a mask layer 108 is formed on the substrate 100 to cover the first region 100*a* and expose the second region 100*b*. In the present embodiment, the mask layer 108 is, for example, a photoresist layer, but the present invention is not limited thereto. After the mask layer 108 is formed, the mask layer 108 is used as an implantation mask, and an implantation process 109 is performed to implant neutral atoms as the dopant into the initial isolation structure 104*s* in the second region 100*b*. The neutral atoms are, for example, C, Ge, Ar or a combination thereof, but the present invention is not limited thereto.

In the present embodiment, the dopant is implanted into a portion of the initial isolation structure 104 located on the top surface of the substrate 100, but the present invention is not limited thereto. In other embodiments, the dopant may be further implanted in the portion of the initial isolation structure 104 located under the top surface of the substrate 100. In addition, during implanting the dopant into the initial isolation structures 104, the dopant may also be implanted into the pad oxide layer 102 in the second region 100*b*. After the dopant is implanted into the initial isolation structures 104 and the pad oxide layer 102, the initial isolation structures 104 and the pad oxide layer 102 are destroyed, so that a higher etching rate may be achieved in the subsequent etching process.

Figure 1C:
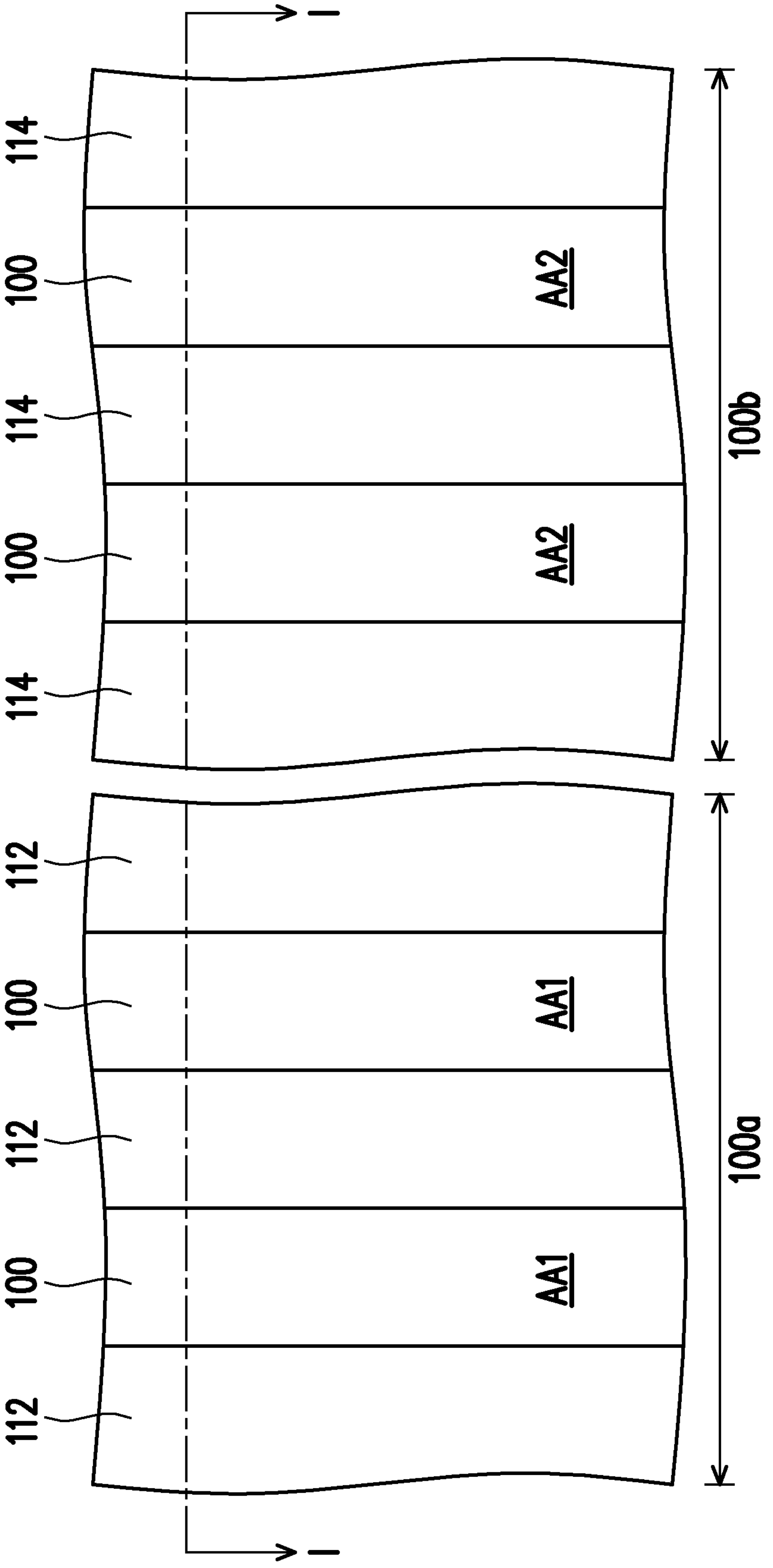
Figure 2C:
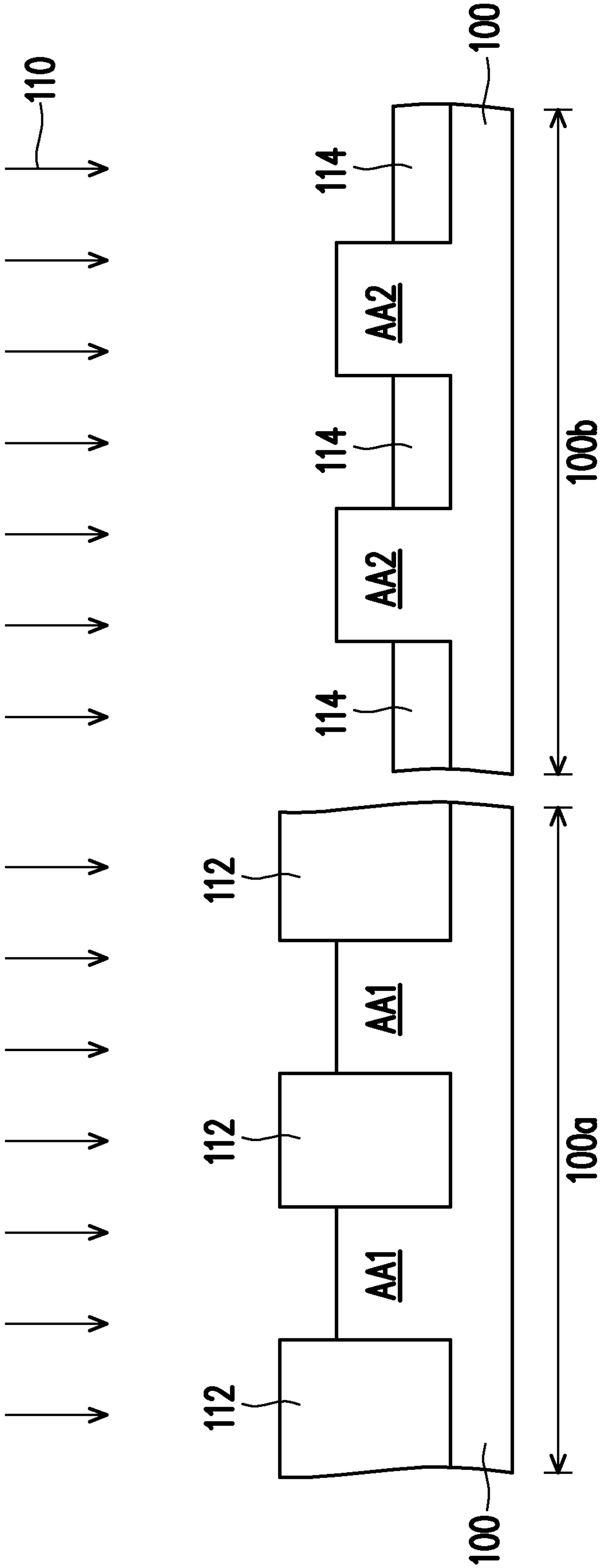

Referring to FIGS. 1C and 2C, the mask layer 108 is removed. Next, a wet etching process 110 is performed on the initial isolation structures 104 and the pad oxide layer 102 in the first region 100*a* and the second region 100*b*. In the present embodiment, a mixed aqueous solution of $NH_4F$ and HF is used as the etchant for the wet etching process 110. The mixed aqueous solution is generally called a buffered oxide etching (BOE) solution.

In the present embodiment, since the initial isolation structures 104 in the first region 100*a* may have a lower etching rate in the etching process and the initial isolation structures 104 in the second region 100*b* may have a higher etching rate in the etching process, after the wet etching process 110, first isolation structures 112 with a larger thickness may be formed in the first region 100*a*, and second isolation structures 114 with a smaller thickness may be formed in the second region 100*b*. Since the pad oxide layer 102 has a smaller thickness than the initial isolation structures 104, the pad oxide layer 102 may be completely removed after the wet etching process 110.

In addition, in the present embodiment, since the first region 100*a* is the analog memory device region and the second region 100*b* is the digital memory device region, by controlling the time of the wet etching process 110 and the depth of the dopant implanted into the initial isolation structures 104, the top surface of the first isolation structure 112 may be controlled to be higher than the top surface of the substrate 100, and the top surface of the second isolation structure 114 may be controlled to be lower than the top surface of the substrate 100.

Figure 1D:
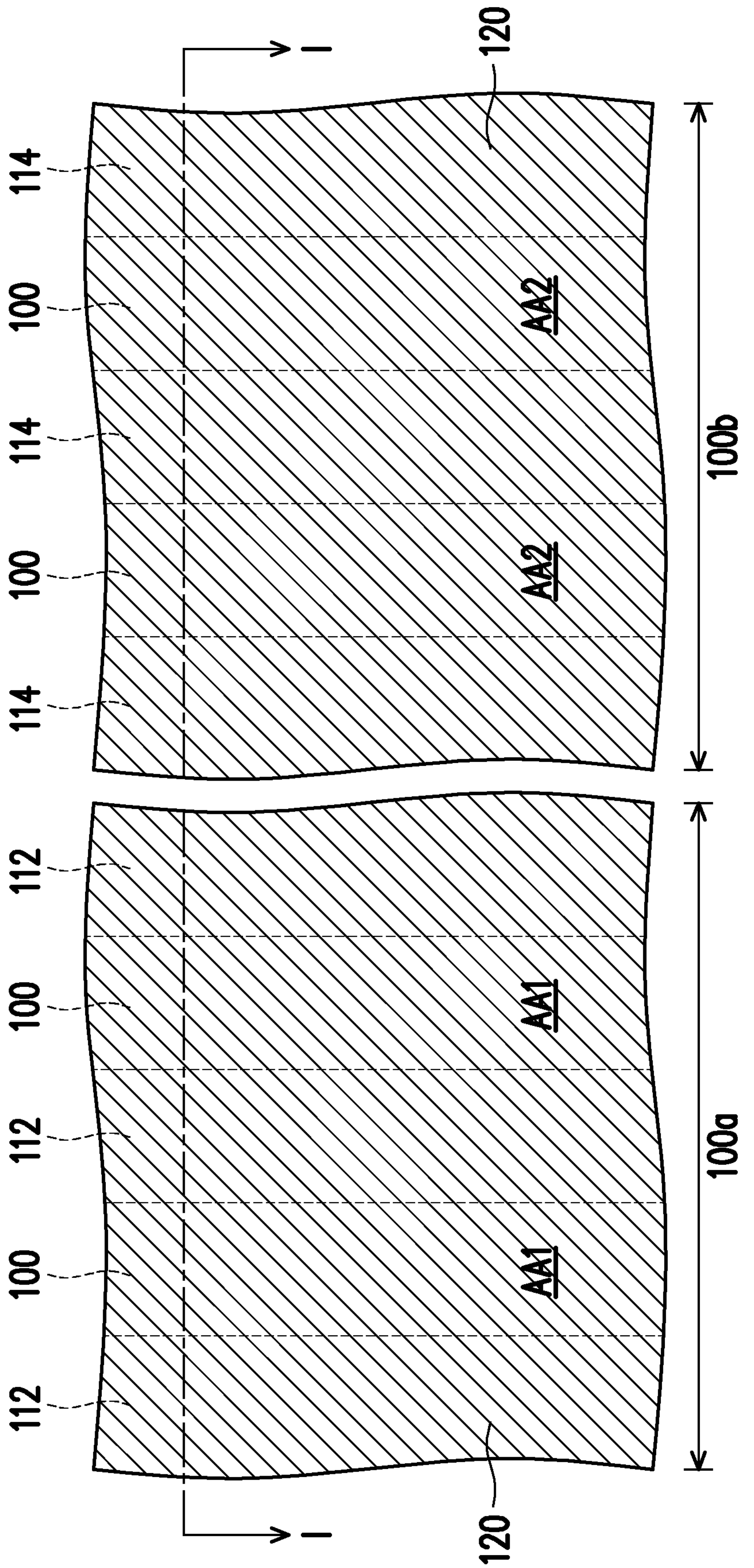
Figure 2D:
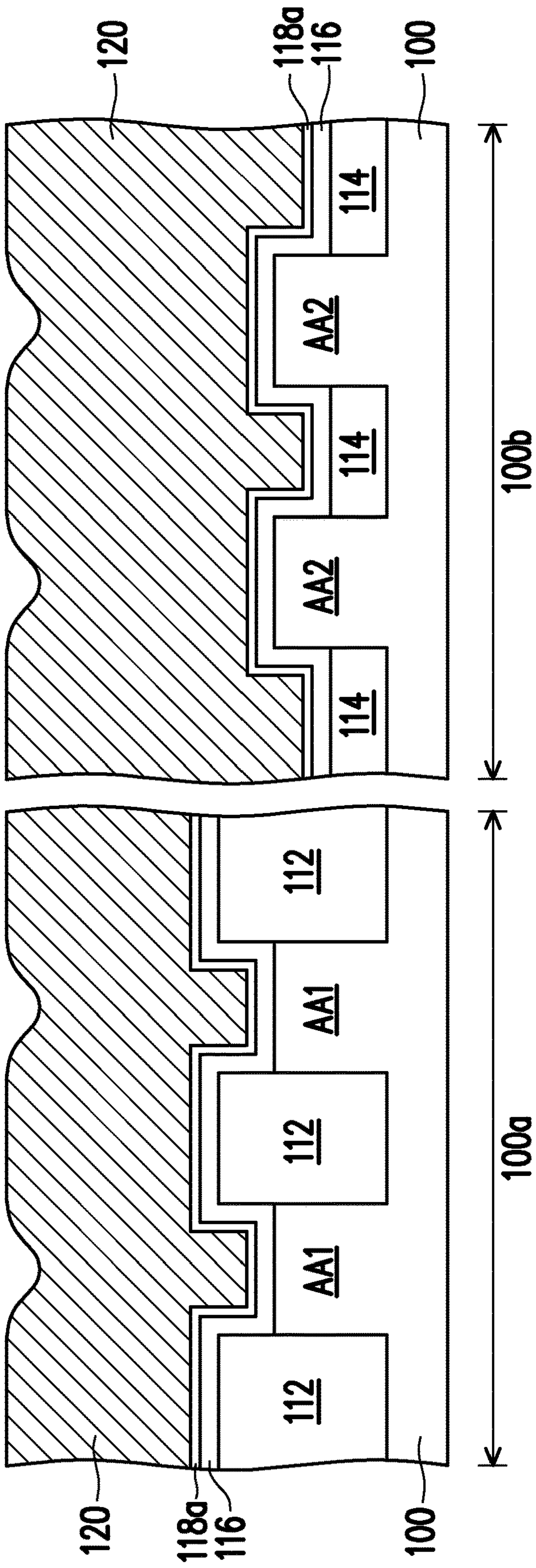

Referring to FIGS. 1D and 2D, a charge storage material layer 116, a high-k material layer 118 and a gate material layer 120 are formed sequentially on the substrate 100, the first isolation structures 112 and the second isolation structures 114. In the present embodiment, the charge storage material layer 116 is, for example, composed of a silicon oxide layer, a silicon nitride layer and a silicon oxide layer stacked in sequence, which is a so-called ONO stacked layer, but the present invention is not limited thereto. The forming method of the charge storage material layer 116 is well known to those skilled in the art and will not be described further here.

In addition, in the present embodiment, the high-k material layer 118 refers to a dielectric layer with a dielectric constant greater than 4 in the present technical field. The material of the high-k material layer 118 may be aluminum oxide ($Al_2O_3$), tantalum oxide ($Ta_2O_3$), titanium oxide ($TiO_2$), yttrium oxide ($Y_2O_3$), zirconium oxide ($ZrO_2$), hafnium oxide ($HfO_2$), lanthanum oxide ($La_2O_3$), etc., but the present invention is not limited thereto.

In addition, in the present embodiment, the material of the gate material layer 120 may be polysilicon. The thickness of the gate material layer 120 is, for example, between 800 Å and 1200 Å. In the present embodiment, since the top surface of the first isolation structure 112 is higher than the top surface of the substrate 100 and the top surface of the second isolation structure 114 is lower than the top surface of the substrate 100, the formed gate material layer 120 have an uneven surface since the formed gate material layer 120 covers the first isolation structures 112 and the second isolation structures 114.

Figure 1E:
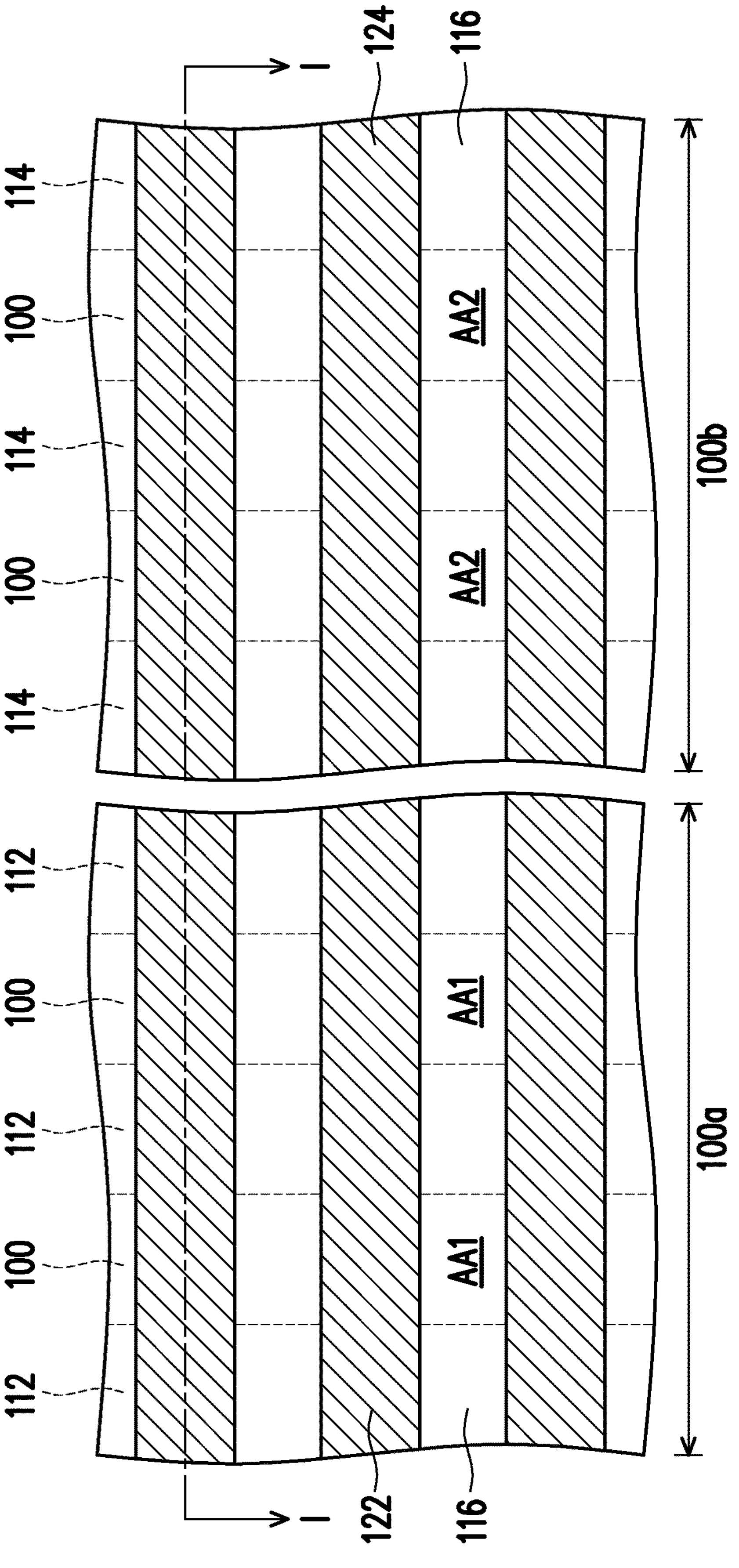
Figure 2E:
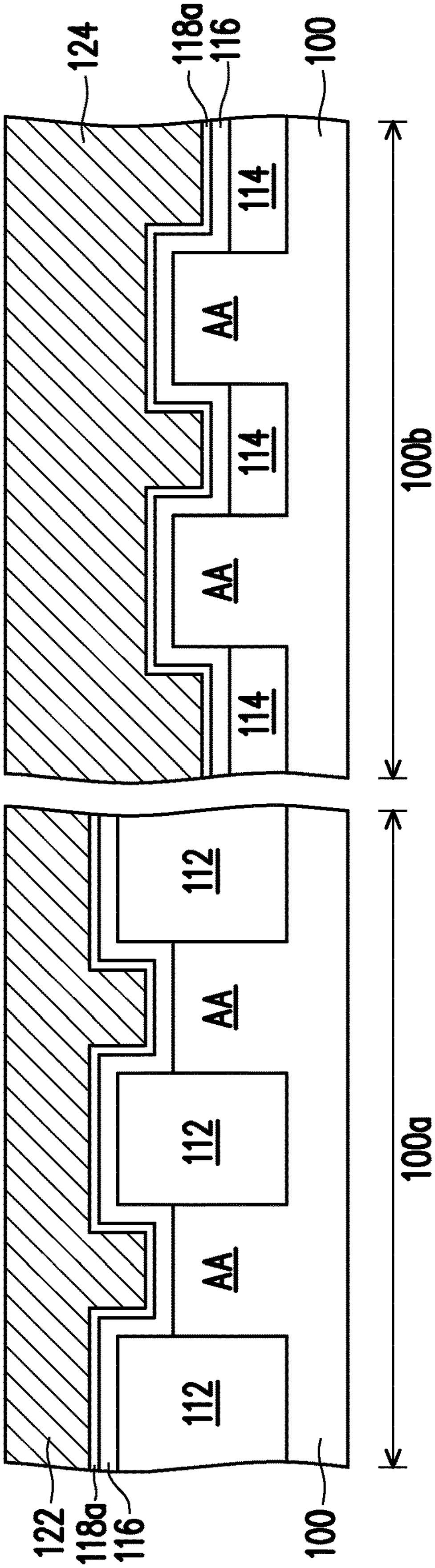

Referring to FIGS. 1E and 2E, a planarization process is performed on the gate material layer 120 so that the gate material layer 120 has a flat surface and a required thickness. In the present embodiment, the planarization process is, for example, a CMP process. In addition, after the planarization process, depending on actual needs, an etching-back process may be performed on the gate material layer 120 to more accurately control the thickness of the remaining gate material layer 120.

Afterwards, a patterning process is performed on the gate material layer 120 and the high-k material layer 118 to remove a part of the gate material layer 120 and a part of the high-k material layer 118. In this way, a high-k layer 118*a* and first gates 122 are formed on the charge storage material layer 116 in the first region 100*a*, and the high-k layer 118*a* and second gates 124 are formed on the charge storage material layer 116 in the second region 100*b*.

As shown in FIG. 1E, after the patterning process, a plurality of gate patterns parallel to each other are formed on the substrate 100, wherein the gate patterns located in the first region 100*a* are the first gates 122, and the gate patterns located in the second region 100*b* are the second gates 124. In the first region 100*a*, each first gate 122 extends across the first active areas AA1 and the first isolation structures 112. In the second region 100*b*, each second gate 124 extends across the second active areas AA2 and the second isolation structures 114.

Figure 1F:
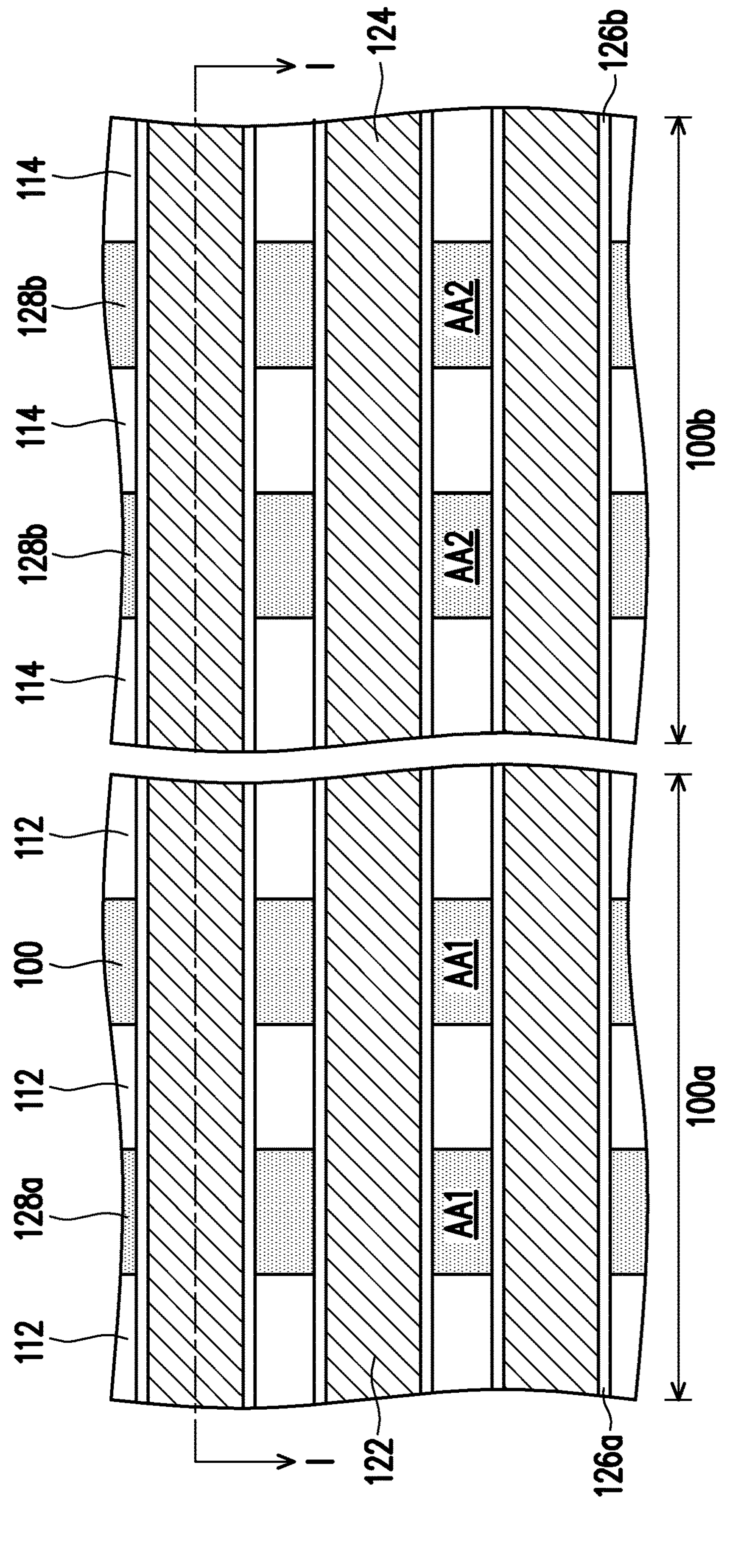
Figure 2F:
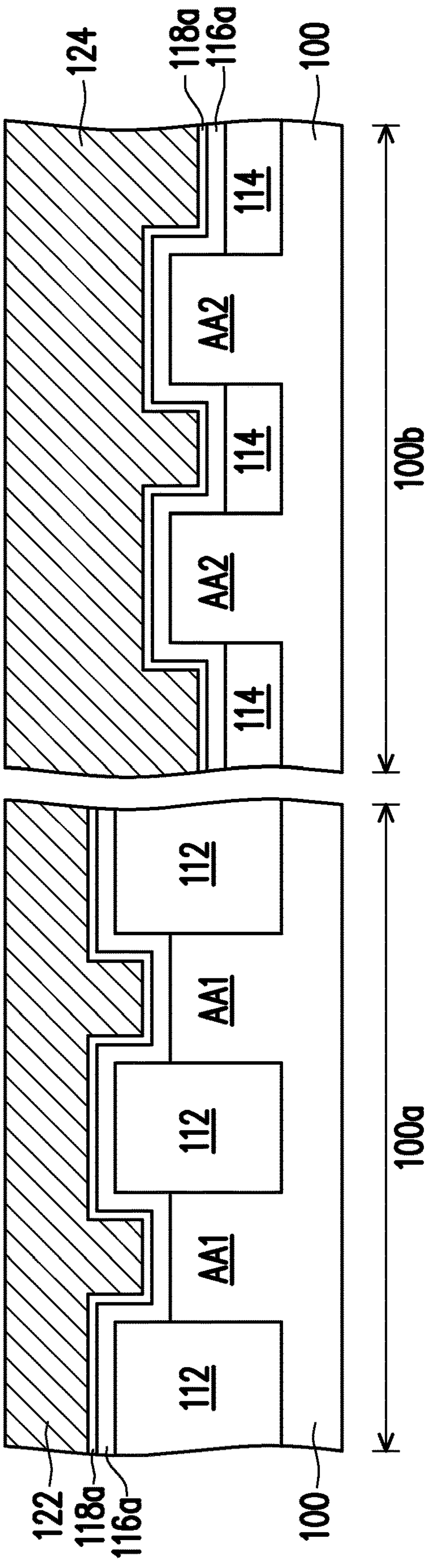

Referring to FIGS. 1F and 2F, first spacers 126*a* are formed on the sidewalls of the first gates 122 and second spacers 126*b* are formed on the sidewalls of the second gates 124. In the present embodiment, the top surface of the first spacer 126*a* may be coplanar with the top surface of the first gate 122, and the top surface of the second spacer 126*b* may be coplanar with the top surface of the second gate 124.

The forming method of the first spacers 126*a* and the second spacers 126*b* may include the following steps. First, a spacer material layer (not shown) is formed on the substrate 100. The spacer material layer covers the top surface of the first gate 122 and the top surface of the second gate 124. Next, a CMP process is performed on the spacer material layer to remove a part of the spacer material layer to reduce the thickness of the spacer material layer. After that, an anisotropic etching process is performed on the remaining spacer material layer until the top surface of the first gate 122 and the top surface of the second gate 124 are exposed.

In the present embodiment, since both the first gates 122 and the second gates 124 have planar top surfaces, after the anisotropic etching process is performed on the remaining spacer material layer, there is no spacer material layer remaining on the top surfaces of the first gates 122 and the second gates 124. In this way, the impact of a residual spacer material layer on subsequent processes may be avoided.

Then, the charge storage material layer 116 located at two sides of the first gates 122 and at two sides of the second gate 124 is removed to form a charge storage layer 116*a* below the first gates 122 and the second gates 124. In the present embodiment, the charge storage material layer 116 is removed by using the first gates 122, the first spacers 126*a*, the second gates 124 and the second spacers 126*b* as a mask. Therefore, in addition to being located between the high-k layer 118*a* and the substrate 100, the charge storage layer 116*a* is also located between the first spacers 126*a* and the substrate 100 and between the second spacers 126*b* and the substrate 100.

Afterwards, using the first gates 122, the first spacers 126*a*, the second gates 124 and the second spacers 126*b* as a mask, an ion implantation process is performed to form doped regions 128*a* in the substrate 100 in the first region 100*a* and doped regions 128*b* in the substrate 100 in the second region 100*b*.

Figure 1G:
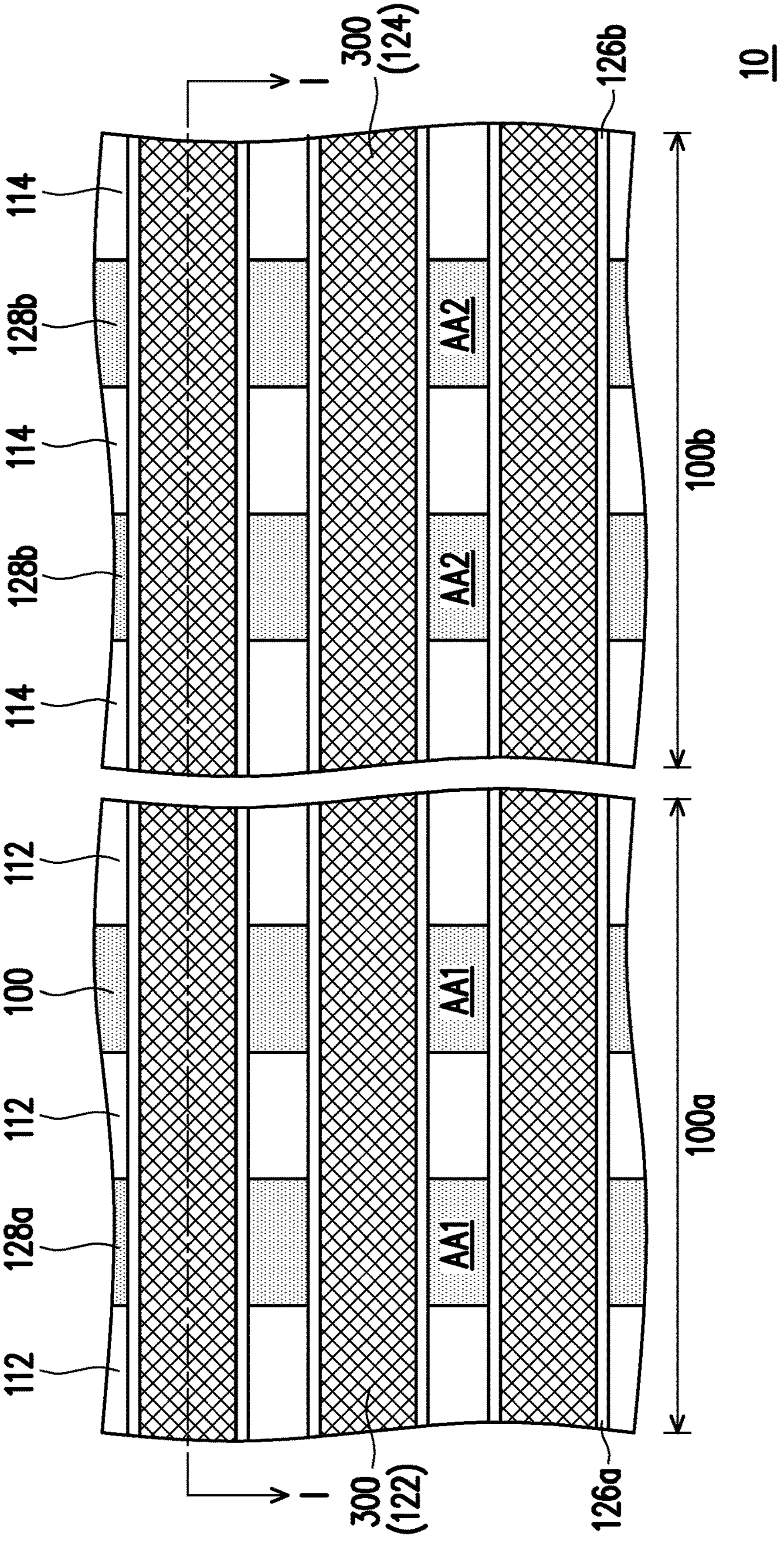
Figure 2G:
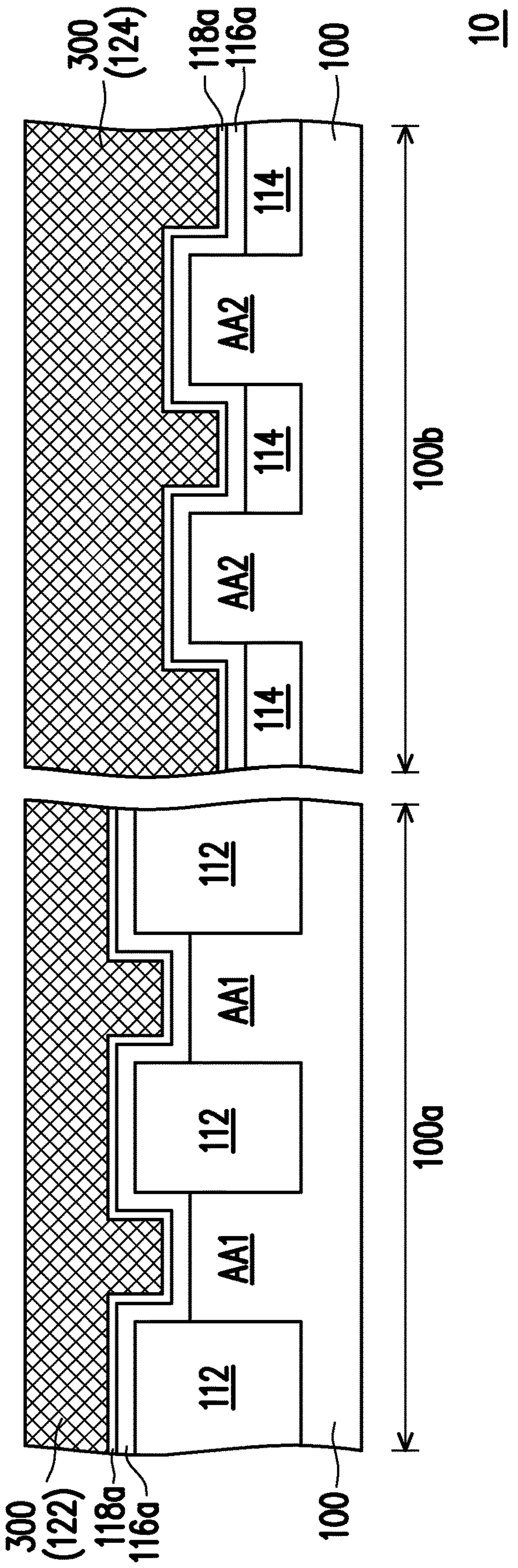

Referring to FIGS. 1G and 2G, a replacement metal gate process (or gate-last process) is performed to replace the silicon used to form the gates in the SONOS stacked configuration with metal. First, the polysilicon material forming the first gates 122 and the second gates 124 is removed. Then, a metal material is filled in the regions where the polysilicon material is removed to form a metal layer 300 on the high-k layer 118*a* as the first gates 122 and the second gates 124. In this way, a memory structure 10 of the present embodiment is formed.

In memory structure 10, the substrate 100, the charge storage layer 116*a*, the high-k layer 118*a*, the first gates 122 and the doped regions 128*a* in first region 100*a* may be constituted the analog memory, and the substrate 100, the charge storage layer 116*a*, the high-k layer 118*a*, the second gates 124 and the doped regions 128*b* in second region 100*b* may be constituted the digital memory. In other words, the analog memory in the first region 100*a* may include the high-k layer 118*a* and a configuration composed of the substrate 100, the charge storage layer 116*a* and the first gate 122 based on the SONOS stacked configuration, and the digital memory in the second region 100*b* includes the high-k layer 118*a* and a configuration composed of the substrate 100, the charge storage layer 116*a* and the second gate 124 based on the SONOS stacked configuration. That is, in the present embodiment, the analog memory and the digital memory may be integrated on substrate 100 to constitute the memory structure 10.

In addition, during the manufacturing process of the memory structure 10, the components of the analog memory and the components of the digital memory may be formed simultaneously, and the isolation structures with different thicknesses may be formed. That is, in the present embodiment, the process of the analog memory, the process of the digital memory and the replacement metal gate process may be integrated together.

Figure 3A:
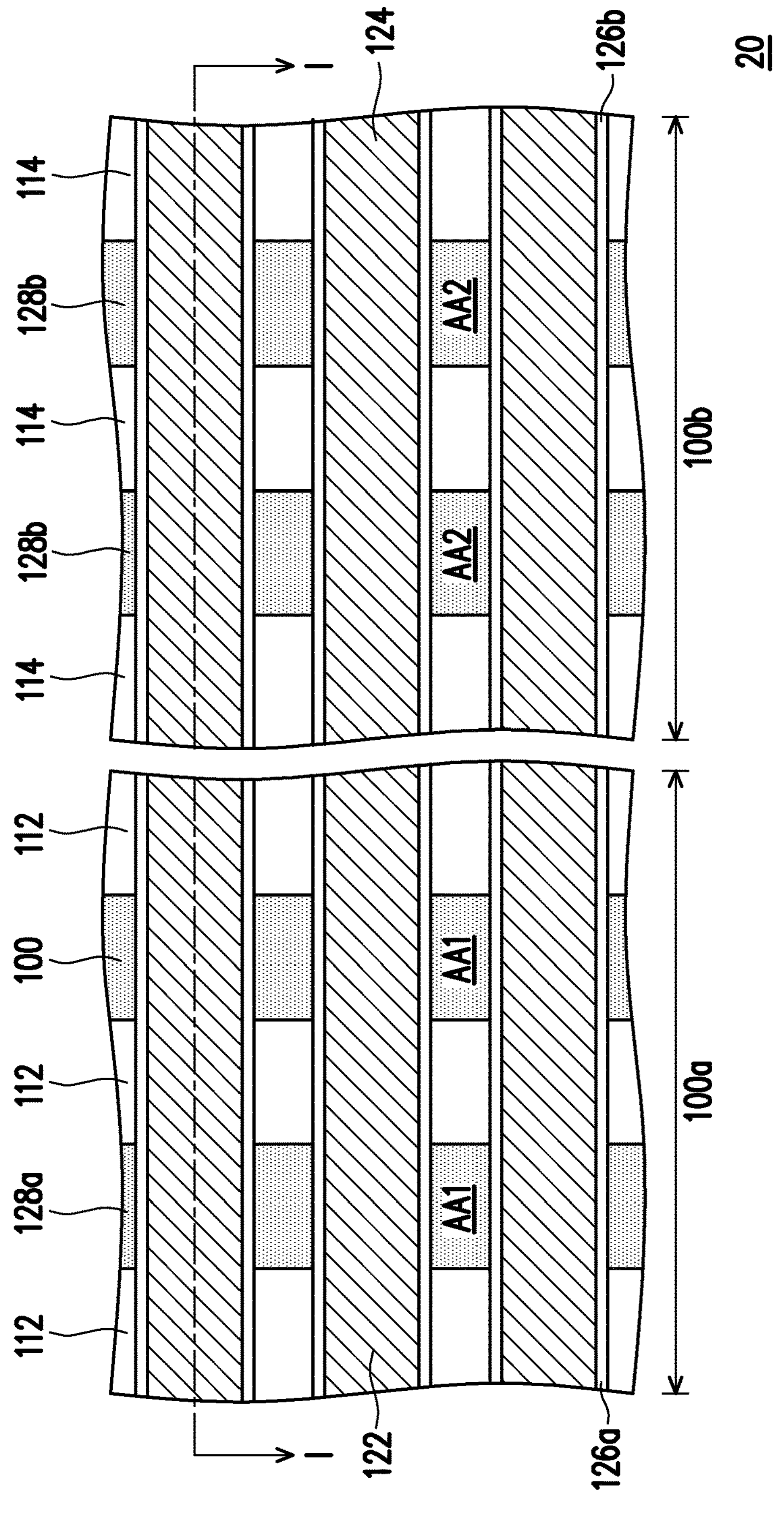
FIG. 3A is a top view of the memory structure of the second embodiment of the present invention.
Figure 3B:
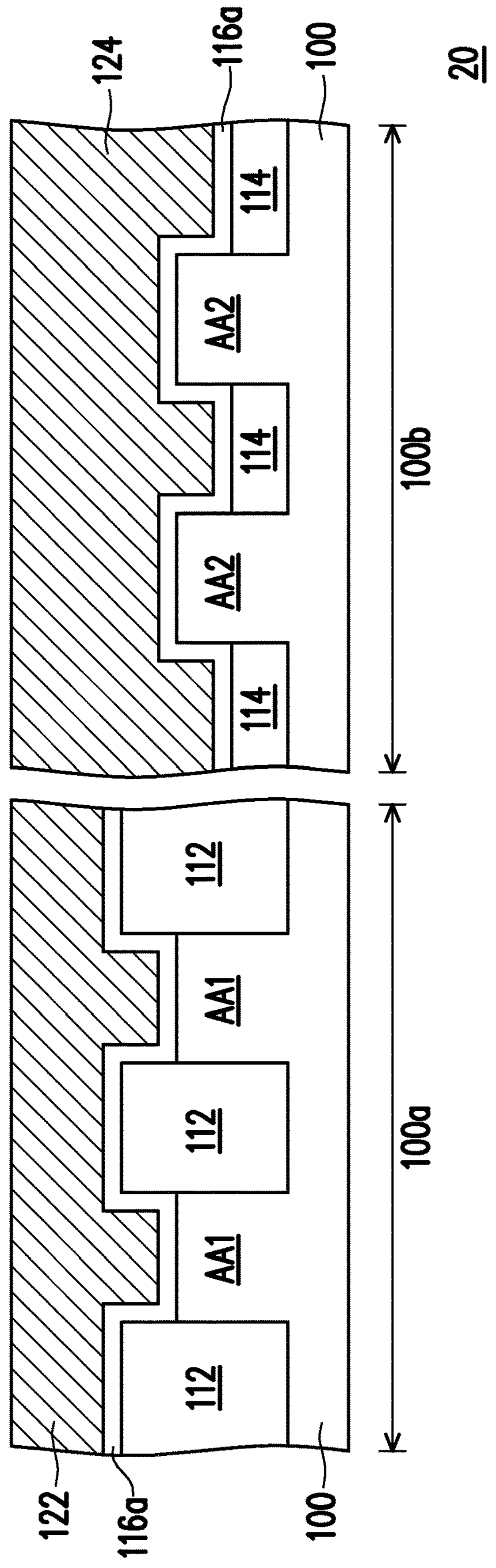
FIG. 3B is a schematic cross-sectional view along the line I-I in FIG. 3A.

FIG. 3A is a top view of the memory structure of the second embodiment of the present invention. FIG. 3B is a schematic cross-sectional view along the line I-I in FIG. 3A. In the present embodiment, the same components as in the first embodiment will be represented by the same reference symbols and will not be described again.

Referring to FIGS. 3A and 3B, the differences between the present embodiment and the first embodiment is that in the memory structure 20 of the present embodiment, the material of the first gate 122 and the second gate 124 is polysilicon, and the high-k layer 118*a* is not disposed.

Specifically, in the steps of FIGS. 1D and 2D, after the charge storage material layer 116 is formed, the gate material layer 120 is directly formed on the charge storage material layer 116 without forming the high-k material layer 118. As a result, in the formed memory structure 20, the analog memory in the first region 100*a* may include a SONOS stacked configuration constituted by the substrate 100, the charge storage layer 116*a* and the first gate 122, and the digital memory in the second region 100*b* may include a SONOS stacked configuration constituted by the substrate 100, the charge storage layer 116*a* and the second gate 124. Therefore, the analog memory and the digital memory are integrated on the substrate 100, and the process of the analog memory and the process of the digital memory may be integrated together.

It will be apparent to those skilled in the art that various modifications and variations may be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A memory structure, comprising:

a substrate, having a first region and a second region;

first isolation structures, disposed in the substrate in the first region to define first active areas, wherein a top surface of each of the first isolation structures is higher than a top surface of the substrate;

second isolation structures, disposed in the substrate in the second region to define second active areas, wherein a top surface of each of the second isolation structures is lower than the top surface of the substrate;

a charge storage layer, disposed on the substrate in the first active areas and the second active areas;

a first gate, disposed on the charge storage layer in the first active areas;

a second gate, disposed on the charge storage layer in the second active areas; and doped regions, disposed in the substrate at two sides of the first gate and at two sides of the second gate.

2. The memory structure of claim 1, wherein a material of the first gate and the second gate comprises polysilicon.

3. The memory structure of claim 1, wherein a material of the first gate and the second gate comprises metal, and the memory structure further comprises a high dielectric constant (high-k) layer disposed between the first gate and the charge storage layer and between the second gate and the charge storage layer.

4. The memory structure of claim 1, wherein the first region is an analog memory device region, and the second region is a digital memory device region.

5. The memory structure of claim 1, further comprising first spacers and second spacers, wherein the first spacers are disposed on sidewalls of the first gate, and the second spacers are disposed on sidewalls of the second gate.

6. The memory structure of claim 5, wherein the charge storage layer is further located between the first spacers and the substrate and between the second spacers and the substrate.

7. A manufacturing method of a memory structure, comprising:

providing a substrate having a first region and a second region;

forming first isolation structures in the substrate in the first region to define first active areas, wherein a top surface of each of the first isolation structures is higher than a top surface of the substrate;

forming second isolation structures in the substrate in the second region to define second active areas, wherein a top surface of each of the second isolation structures is lower than the top surface of the substrate;

forming a charge storage layer on the substrate in the first active areas and the second active areas;

forming a first gate on the charge storage layer in the first active areas;

forming a second gate on the charge storage layer in the second active areas; and forming doped regions in the substrate at two sides of the first gate and at two sides of the second gate.

8. The manufacturing method of claim 7, wherein a forming method of the first isolation structures and the second isolation structures comprises:

forming a plurality of initial isolation structures in the substrate, wherein a top surface of each of the plurality of initial isolation structures is higher than the top surface of the substrate;

performing a thermal treatment on the plurality of initial isolation structures;

performing an implantation process on the initial isolation structures in the second region; and performing a wet etching process on the initial isolation structures in the first region and the second region.

9. The manufacturing method of claim 8, wherein a temperature of the thermal treatment is between 850° C. and 1050° C.

10. The manufacturing method of claim 8, wherein a time of the thermal treatment is between 30 seconds and 60 seconds.

11. The manufacturing method of claim 8, wherein a dopant used in the implantation process comprises neutral atoms.

12. The manufacturing method of claim 11, wherein the neutral atoms comprise C, Ge, Ar or a combination thereof.

13. The manufacturing method of claim 7, wherein a forming method of the first gate, the second gate and the charge storage layer comprises:

forming a charge storage material layer and a gate material layer sequentially on the substrate, the first isolation structures and the second isolation structures;

performing a patterning process to remove a part of the gate material layer to form the first gate and the second gate; and removing the charge storage material layer at two sides of the first gate and at two sides of the second gate to form the charge storage layer.

14. The manufacturing method of claim 13, further comprising performing a planarization process on the gate material layer after forming the gate material layer and before performing the patterning process.

15. The manufacturing method of claim 14, further comprising performing an etching-back process on the gate material layer after performing the planarization process and before performing the patterning process.

16. The manufacturing method of claim 7, further comprising forming first spacers on sidewalls of the first gate and second spacers on sidewalls of the second gate after forming the first gate and the second gate.

17. The manufacturing method of claim 16, wherein a forming method of the first spacers and the second spacers comprises:

forming a spacer material layer on the substrate, wherein the spacer material layer covers a top surface of the first gate and a top surface of the second gate; and removing a part of the spacer material layer to form the first spacers and the second spacers.

18. The manufacturing method of claim 17, wherein a method for removing the part of the spacer material layer comprises:

performing a chemical mechanical polishing process on the spacer material layer to remove a part of the spacer material layer; and performing an anisotropic etching process on a remaining portion of the spacer material layer until the top surface of the first gate and the top surface of the second gate are exposed.

19. The manufacturing method of claim 7, wherein a material of the first gate and the second gate comprises polysilicon.

20. The manufacturing method of claim 19, wherein further comprising:

forming a high-k layer between the first gate and the charge storage layer and between the second gate and the charge storage layer;

removing the polysilicon; and forming a metal material on the high-k layer.

* * * * *